US012615865B2

(12) United States Patent
Mase

(10) Patent No.: US 12,615,865 B2
(45) Date of Patent: Apr. 28, 2026

(54) PACKAGE

(71) Applicants: NGK ELECTRONICS DEVICES, INC., Mine (JP); NGK INSULATORS, LTD., Nagoya (JP)

(72) Inventor: Atsushi Mase, Nagoya (JP)

(73) Assignees: NGK ELECTRONICS DEVICES, INC., Mine (JP); NGK INSULATORS, LTD, Nagoya (JP)

( * ) Notice: Subject to any disclaimer, the term of this patent is extended or adjusted under 35 U.S.C. 154(b) by 365 days.

(21) Appl. No.: 18/334,594

(22) Filed: Jun. 14, 2023

(65) Prior Publication Data

US 2023/0335568 A1      Oct. 19, 2023

Related U.S. Application Data

(63) Continuation of application No. PCT/JP2020/047347, filed on Dec. 18, 2020.

(51) Int. Cl.
H10F 39/00          (2025.01)

(52) U.S. Cl.
CPC ......... H10F 39/804 (2025.01); H10F 39/811 (2025.01)

(58) Field of Classification Search
CPC ....... H10F 39/804; H10F 39/811; H01L 23/02
See application file for complete search history.

(56) References Cited

U.S. PATENT DOCUMENTS

2021/0090964 A1      3/2021   Atago

FOREIGN PATENT DOCUMENTS

| JP | 2005216932 A | * | 8/2005 |
| JP | 2018-166201 A | | 10/2018 |
| JP | 2019-129276 A | | 8/2019 |

OTHER PUBLICATIONS

International Search Report of PCT/JP2020/047347 dated Mar. 9, 2021.
International Preliminary Report on Patentability received in corresponding International Application No. PCT/JP2020/047347 dated Jun. 29, 2023.

* cited by examiner

*Primary Examiner* — Jonathan Han
(74) *Attorney, Agent, or Firm* — MATTINGLY & MALUR, PC

(57)          ABSTRACT

A package includes a mounting surface on which an electronic component is to be mounted, a cavity, and an attachment surface to which a lid is to be attached through an adhesive layer. The package includes: a bottom containing ceramics and having the mounting surface; and a frame containing ceramics and having the attachment surface. The attachment surface of the frame includes an inner end adjacent to the cavity and an outer end opposite to the inner end in at least one cross-sectional view spanning an inside and an outside of the cavity, the attachment surface having a protruding shape protruding in a thickness direction. At least one of the inner end or the outer end is made lower than a most protruding portion of the protruding shape by 10 μm or more.

5 Claims, 5 Drawing Sheets

900

901 902 SM CV SI SF SO 906
907

800

800

CV SI SF SO

SM

812 } 810
811 }

823
820 { 822
821

F I G. 3
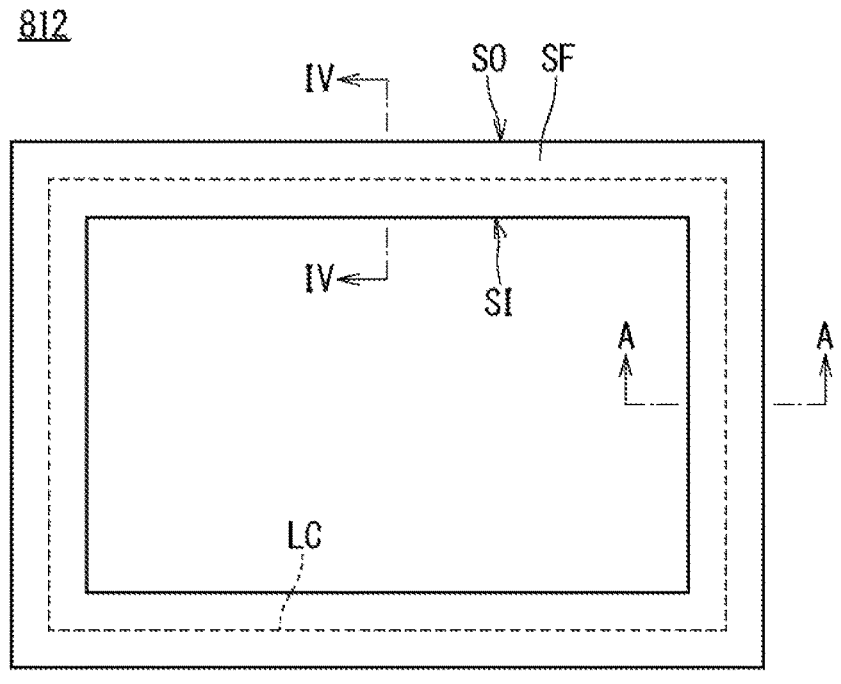
F I G. 4
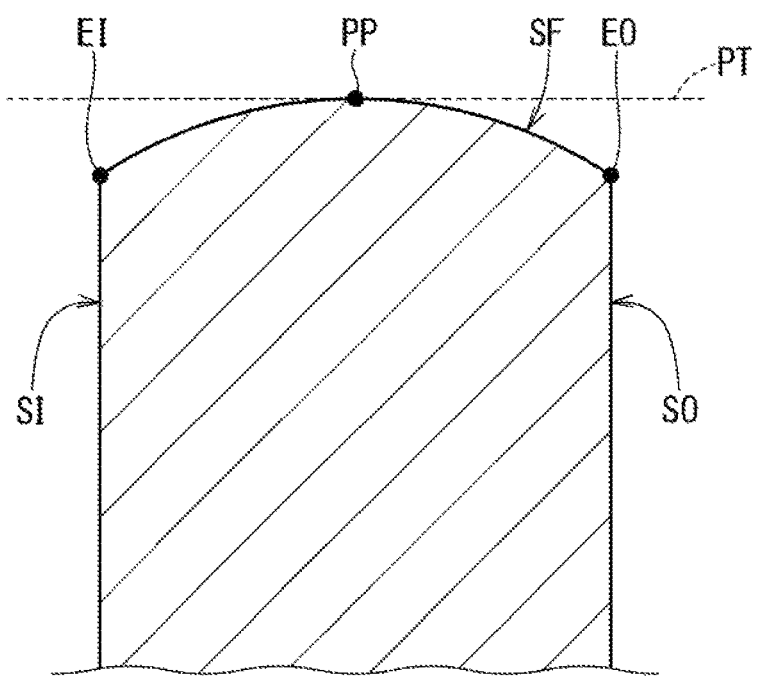

F I G. 7
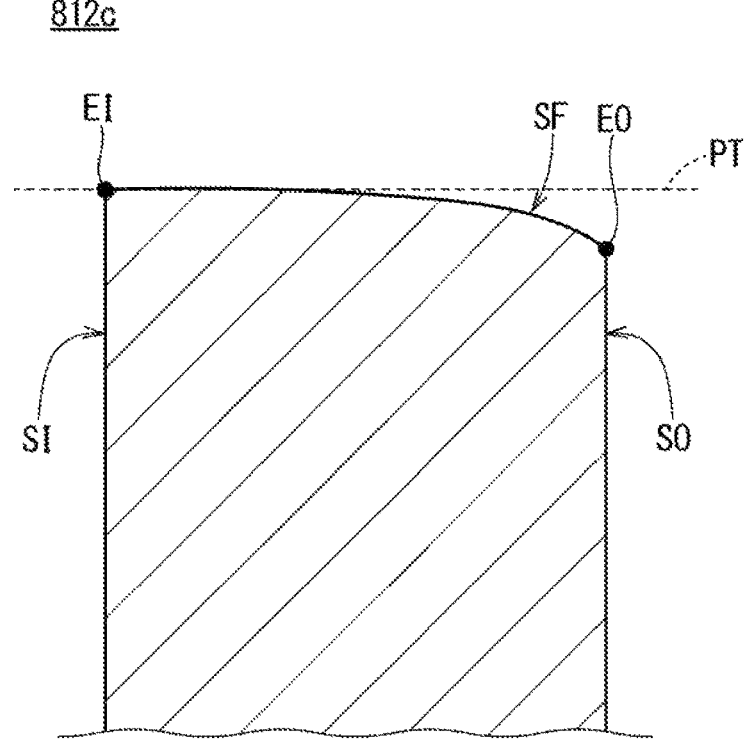
F I G. 8
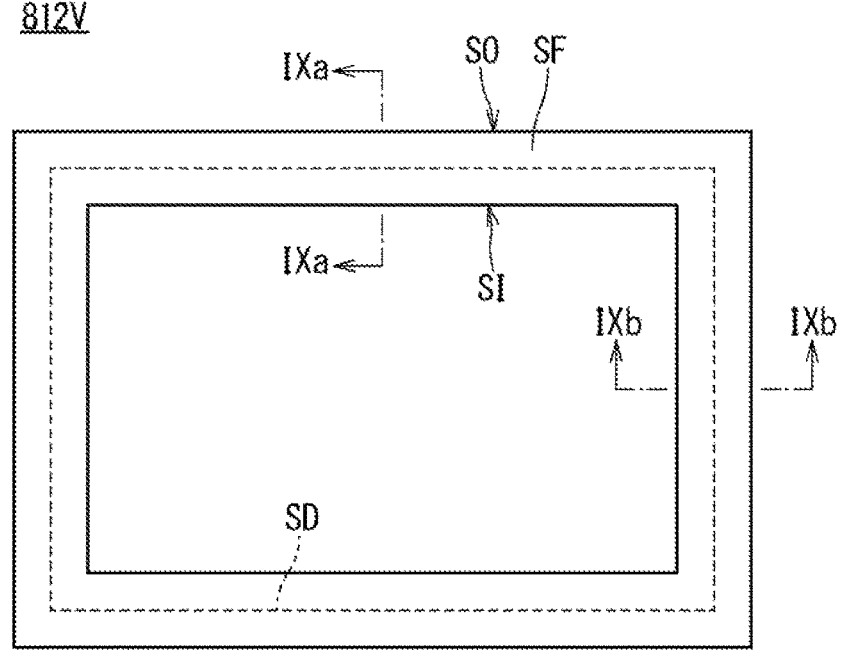

1

PACKAGE

CROSS-REFERENCE TO RELATED APPLICATION

This application is a continuation application of PCT/JP2020/047347, filed on Dec. 18, 2020, the content of which is hereby incorporated by reference into this application.

BACKGROUND OF THE INVENTION

Field of the Invention

The present invention relates to a package, and particularly to a package for an electronic component.

Description of the Background Art

Solid state image sensors such as charge coupled devices (CCDs) or complementary metal-oxide semiconductors (CMOSs) have widely been used in digital cameras, video cameras, and other imaging apparatuses. In manufacturing an imaging apparatus, first, an imaging unit including a hermetically sealed solid state image sensor (e.g., an electronic component known as a "CMOS/CCD package") is normally prepared, and the imaging unit is incorporated into the imaging apparatus. The imaging unit typically includes an image sensor, a ceramic package with a cavity accommodating the image sensor, and a lid sealing the cavity. In many cases, the lid is fixed to the package by bonding, through an adhesive layer, the lid to an attachment surface of a frame of the package.

While recent years have seen the use of larger image sensors, reduction in the size of imaging units (CMOS/CCD packages) has been sought. The size of imaging units can be reduced by reducing the width of the attachment surface to which the lid is bonded. However, this method easily leads to a decrease in the adhesion strength of the lid. Thus, a technology for ensuring sufficiently high adhesion strength while reducing the width of the attachment surface is desired.

Japanese Patent Application Laid-Open No. 2018-166201 discloses a substrate for an imaging apparatus. The substrate for the imaging apparatus includes a ceramic wiring board (package), and a frame component made of a metal. The ceramic wiring board includes a substrate whose upper surface includes a mounting region on which an image sensor is mounted, and a frame part (frame) mounted on the substrate and enclosing the mounting region. Each of the substrate and the frame part is rectangular in a plan view. The frame component is bonded to the upper surface of the frame part through a bonding material, and includes a protruding part protruding more outward than the side surface of the ceramic wiring board. A height in each corner of the frame part from the upper surface of the frame part to the upper surface of the frame component is lower than that in a center of the sides of the frame part. According to the argument described in the Application above, when the lid is bonded to the upper surface of the frame component through a bonding material (adhesive layer), the bonding material in corners of the lid is thicker than that in other portions, because the height in the corner of the frame part from the upper surface of the frame part to the upper surface of the frame component is lower than that in the center of the sides of the frame part. Thus, the bonding strength of the lid increases.

According to the technology of the aforementioned Application, locally increasing the thickness of the adhesive layer in the corners of the frame may increase the adhesion strength near the corners of the frame. However, the adhesion strength in positions distant from the corners cannot be increased. Moreover, the aforementioned structure requires the frame component made of a metal as an additional component to a conventional structure.

This significantly increases the manufacturing cost of the package.

SUMMARY

The present invention has been conceived to solve the problems, and has an object of providing a package that can increase the adhesion strength of an adhesive layer that bonds a frame to a lid, without using a specific additional component.

A package according to an aspect of the present invention includes a mounting surface on which an electronic component is to be mounted, a cavity on the mounting surface, and an attachment surface to which a lid for sealing the cavity is to be attached through an adhesive layer. The package includes a bottom, a frame, and a wiring part. The bottom contains ceramics and has the mounting surface. The frame contains ceramics, encloses the cavity on the bottom outside the mounting surface, and has the attachment surface. The wiring part connects an inside and an outside of the cavity. The attachment surface of the frame includes an inner end adjacent to the cavity and an outer end opposite to the inner end in at least one cross-sectional view spanning the inside and the outside of the cavity, the attachment surface having a protruding shape protruding in a thickness direction. At least one of the inner end or the outer end is made lower than a most protruding portion of the protruding shape by 10 $\mu$m or more.

The outer end of the protruding shape of the attachment surface may be made lower than the most protruding portion of the protruding shape of the attachment surface by 10 $\mu$m or more. Each of the inner end and the outer end of the protruding shape of the attachment surface may be made lower than the most protruding portion of the protruding shape of the attachment surface by 10 $\mu$m or more. The outer end of the protruding shape of the attachment surface may be made lower than the inner end of the protruding shape of the attachment surface. A distance between the most protruding portion of the protruding shape of the attachment surface and each of the inner end and the outer end of the attachment surface in the thickness direction may be shorter than or equal to 100 $\mu$m.

The at least one cross-sectional view may include a first cross-sectional view and a second cross-sectional view. In the first cross-sectional view, the most protruding portion has a first height position, and at least one of the inner end or the outer end is made lower than the first height position by 20 $\mu$m or more. In the second cross-sectional view, the most protruding portion has a second height position, and at least one of the inner end or the outer end is made lower than the second height position by 10 $\mu$m or more and less than m. The second height position in the second cross-sectional view is lower than the first height position in the first cross-sectional view.

According to an aspect of the present invention, the attachment surface of the frame has a protruding shape such that at least one of an inner end or an outer end is made lower than the most protruding portion by 10 $\mu$m or more in a cross-sectional view spanning the inside and the outside of the cavity. An adhesive layer accumulated in such a lowered region can sufficiently secure the thickness of the adhesive layer in the cross-sectional view, without using a specific additional component. This can increase the adhesion strength of the adhesive layer that bonds the frame to the lid.

The outer end of the protruding shape may be made lower than the most protruding portion of the protruding shape by 10 μm or more. This can more sufficiently secure the thickness of the adhesive layer at the outer end of the protruding shape. This can also retard start of development of delamination between the frame and the lid due to the force from outside the package acting near the outer end of the protruding shape.

Each of the inner end and the outer end of the protruding shape may be made lower than the most protruding portion of the protruding shape by 10 μm or more. This can more sufficiently secure the thickness of the adhesive layer at both of the inner end and the outer end of the protruding shape. This can also retard start of development of delamination between the frame and the lid from the ends of the adhesive layer.

The outer end of the protruding shape may be made lower than the inner end of the protruding shape. This can also retard start of development of delamination between the frame and the lid due to the force from outside the package acting near the outer end of the protruding shape, while reducing the amount of the adhesive layer to some extent.

A distance between the most protruding portion of the protruding shape and each of the inner end and the outer end in a thickness direction may be shorter than or equal to 100 μm. This can spread the adhesive layer to both of the inner end and the outer end of the protruding shape, while reducing the amount of the adhesive layer to some extent.

The object, features, aspects, and advantages of the present invention will become more apparent from the following detailed description and the accompanying drawings.

BRIEF DESCRIPTION OF DRAWINGS

FIG. 3 is a plan view schematically illustrating a structure of a frame in FIG. 2.

FIG. 4 is a partial cross-sectional view of the frame taken along the line IV-IV in FIG. 3.

FIG. 7 illustrates a third modification of FIG. 4.

FIG. 8 is a plan view schematically illustrating a structure of a frame as a modification.

DESCRIPTION OF THE PREFERRED
EMBODIMENTS

An embodiment of the present invention will be hereinafter described with reference to the drawings.

Figure 1:
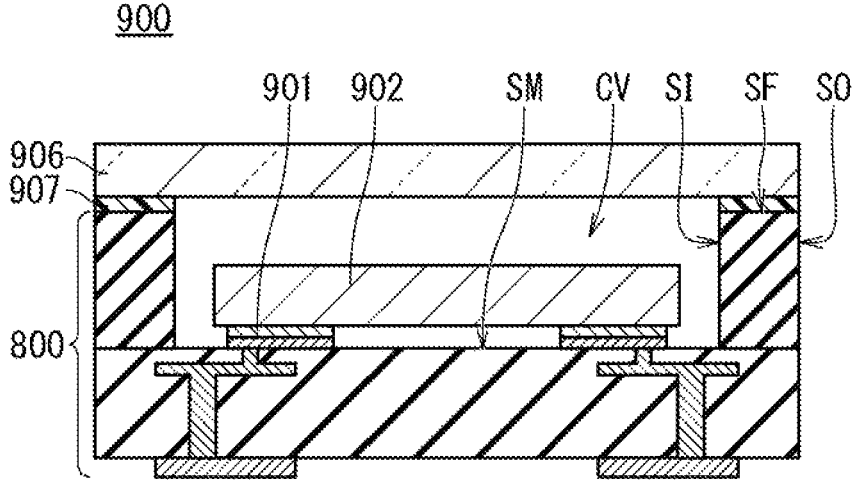
FIG. 1 is a cross-sectional view schematically illustrating a structure of an electronic apparatus according to an embodiment of the present invention.
Figure 2:
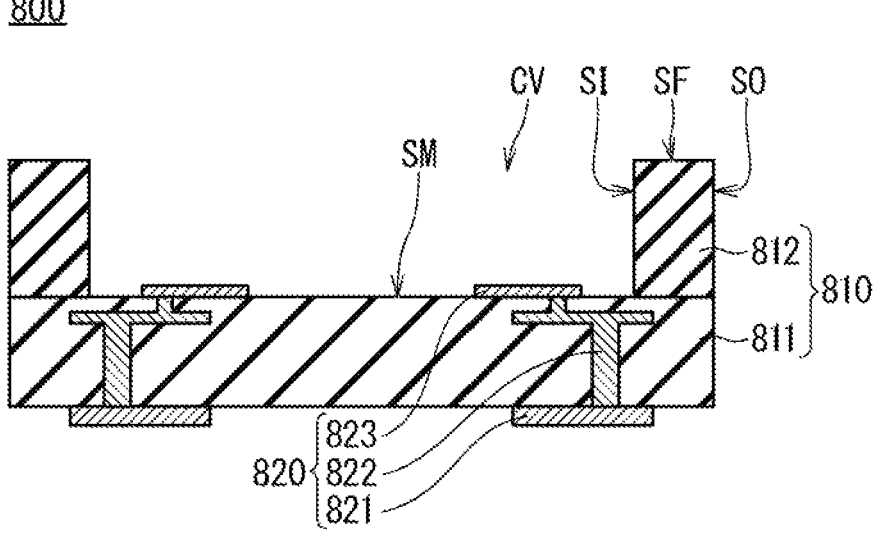
FIG. 2 is a cross-sectional view schematically illustrating a structure of a package in FIG. 1.

FIG. 1 and FIG. 2 are cross-sectional views schematically illustrating a structure of an electronic apparatus 900 according to the embodiment and a structure of a package 800 to be used for manufacturing the electronic apparatus 900, respectively.

The package 800 (FIG. 2) includes a mounting surface SM on which an electronic component 902 (FIG. 1) is to be mounted, a cavity CV on the mounting surface SM, and an attachment surface SF to which a lid 906 for sealing the cavity CV is to be attached through an adhesive layer 907. The package 800 includes a base 810 and a wiring part 820.

The base 810 includes a bottom 811 having the mounting surface SM, and a frame 812 enclosing, on the bottom 811, the cavity CV outside the mounting surface SM. The frame 812 includes the attachment surface SF.

Each of the bottom 811 and the frame 812 included in the base 810 contains ceramics. The ceramics are substantially made of an insulator so that the base 810 can function as an insulating component. As long as this function can be fulfilled, the entire ceramics are not necessarily completely made of an insulator. For example, a trace amount of non-insulating grains may disperse in insulating grains that account for a great majority of percentages of the volume.

The mounting surface SM preferably has a size to include a rectangle with long sides longer than or equal to 10 mm. For example, the mounting surface SM is a rectangle with long sides longer than or equal to 10 mm. The mounting surface SM may have a size to include a square with sides longer than or equal to 10 mm. A square is one type of a rectangle under the definition of geometry.

The frame 812 is formed to enclose the cavity CV on the bottom 811 outside the mounting surface SM. The frame 812 may include an as-fired surface of ceramics, as the attachment surface SF. Here, the word "as-fired" means a sintered state without any surface treatment. Thus, the "as-fired surface" is a surface having an as-fired state. In other words, the "as-fired surface" means an external surface of a ceramic product after sintering. Thus, a polished surface is not an as-fired surface. The attachment surface SF of the frame 812 is not limited to an as-fired surface but may be, for example, a polished surface.

The wiring part 820 connects an inside and an outside of the cavity CV. In other words, the wiring part 820 extends from the cavity CV and penetrates through the base 810. Specifically, the wiring part 820 includes an external electrode terminal 821 outside the cavity CV, an interconnection 822 penetrating through the base 810, and an internal electrode terminal 823 facing the cavity CV. The interconnection 822 may be formed from at least one of an internal electrode layer or a via interconnection. The wiring part 820 is substantially made of a conductor so that the wiring part 820 can function as a wiring component. As long as this function can be fulfilled, this entire material is not necessarily completely made of a conductor. For example, insulating regions may disperse in conducting regions that account for a major proportion of the volume.

The electronic component 902 (FIG. 1) is bonded to the internal electrode terminal 823 through a bonding layer 901. Thus, the electronic component 902 is mounted on the mounting surface SM through the bonding layer 901 and the internal electrode terminal 823. The electronic component 902 may be sized to contain a rectangle with long sides longer than or equal to 10 mm, and is sized to contain, for example, a square with sides longer than or equal to 10 mm. The electronic component 902 may be a solid state image sensor. The solid state image sensor is, for example, a CMOS image sensor. Typically, CMOS image sensors are particularly superior as solid state image sensors including large imagers that are required for, for example, single-lens reflex cameras, a part of monitoring cameras, and industrial cameras. The solid state image sensor may have a planar shape that is a rectangle with long sides longer than or equal to 10 mm or an approximate square with sides longer than or equal to 10 mm. The size and the type of the electronic component 902 are not particularly limited.

The lid 906 is attached to the attachment surface SF of the frame 812 through the adhesive layer 907. This seals the cavity CV of the package 800. The adhesive layer 907 is made of, for example, a resin adhesive. The adhesive layer 907 may be in contact with each of the attachment surface SF and the lid 906. When the electronic component 902 is a solid state image sensor, at least a part of the lid 906 is substantially transparent to the light to be imaged. Typically, the entire lid 906 is substantially transparent to the light to be imaged.

FIG. 3 is a plan view schematically illustrating a structure of the frame 812 (FIG. 2). FIG. 4 is a partial cross-sectional view of the frame 812 taken along the line IV-IV in FIG. 3.

The frame 812 includes the attachment surface SF, an inner surface SI facing the cavity CV (FIG. 2), and an outer surface SO located outside the cavity CV in a cross-sectional view spanning the inside and the outside of the cavity CV (FIG. 4). In this cross-sectional view, the attachment surface SF includes an inner end EI adjacent to the cavity CV, and an outer end EO opposite to the inner end EI. The attachment surface SF has a protruding shape protruding in a thickness direction in this cross-sectional view. In FIG. 4, the attachment surface SF has a protruding shape protruding upward in a vertical direction.

At least one of the inner end EI or the outer end EO is made lower than the most protruding portion PP of the protruding shape by 10 μm or more. In FIG. 4, at least one of the inner end EI or the outer end EO is separated from a height position PT of the most protruding portion PP of the protruding shape downward by 10 μm or more in the vertical direction. The height position PT represents a position corresponding to a horizontal line including the most protruding portion PP, and the horizontal line is a straight line parallel to a horizontal plane of the package 800. The horizontal plane of the package 800 is an approximate plane of the attachment surface SF (FIG. 3). The approximate plane may be calculated by, for example, fitting the plane to a surface profile of the attachment surface SF which has been measured along a broken line LC in FIG. 3. The broken line LC may be a center line of the frame 812 in a width direction. The surface profile may be optically measured.

In the embodiment, the outer end EO is made lower than the most protruding portion PP of the protruding shape by 10 μm or more. Furthermore, the inner end EI is also made lower than the most protruding portion PP of the protruding shape by 10 μm or more. In other words, each of the inner end EI and the outer end EO of the protruding shape is made lower than the most protruding portion PP of the protruding shape by 10 μm or more.

A distance between the most protruding portion PP of the protruding shape and each of the inner end EI and the outer end EO in a thickness direction (the vertical direction in FIG. 4) is shorter than or equal to 100 μm. In FIG. 4, a distance between the height position PT of the most protruding portion PP of the protruding shape and each of the inner end EI and the outer end EO in the vertical direction is shorter than or equal to 100 μm.

Although the wiring part 820 (FIG. 2) penetrates through the bottom 811 in the embodiment, a wiring part to be connected to the electronic component 902 through a bonding wire may be disposed as a modification. Here, a step for supporting an electrode pad to which the bonding wire is bonded may be disposed at the inner surface SI at a position sufficiently distant from the attachment surface SF (specifically, a position separated from the height position PT of the most protruding portion PP (FIG. 4) downward in the thickness direction by 100 μm or more). As another modification, a wiring part penetrating between the bottom 811 and the frame 812 or a wiring part penetrating through the frame 812 may be disposed, and the wiring part may be a lead frame.

According to the embodiment, in a cross-sectional view spanning the inside and the outside of the cavity CV, the attachment surface SF of the frame 812 has a protruding shape such that at least one of the inner end EI or the outer end EO is made lower than the most protruding portion PP by 10 μm or more. The adhesive layer 907 (FIG. 1) accumulated in such a lowered region can sufficiently secure the thickness of the adhesive layer 907 in the cross-sectional view, without using a specific additional component. This can increase the adhesion strength of the adhesive layer 907 that bonds the frame 812 to the lid 906.

The outer end EO of the protruding shape may be made lower than the most protruding portion PP of the protruding shape by 10 μm or more. Thus, the more sufficient thickness of the adhesive layer 907 at the outer end EO of the protruding shape can be easily secured. This can retard start of development of delamination between the frame 812 and the lid 906 due to the force from outside the package 800 acting near the outer end EO of the protruding shape.

Each of the inner end EI and the outer end EO of the protruding shape may be made lower than the most protruding portion PP of the protruding shape by 10 μm or more. Thus, the more sufficient thickness of the adhesive layer 907 at both of the inner end EI and the outer end EO of the protruding shape can be easily secured. This can retard start of development of delamination between the frame 812 and the lid 906 from either end of the adhesive layer 907.

A distance between the most protruding portion PP of the protruding shape and each of the inner end EI and the outer end EO in a thickness direction may be shorter than or equal to 100 μm. This can spread the adhesive layer 907 to both of the inner end EI and the outer end EO of the protruding shape, while reducing the amount of the adhesive layer 907 to some extent.

Figure 5:
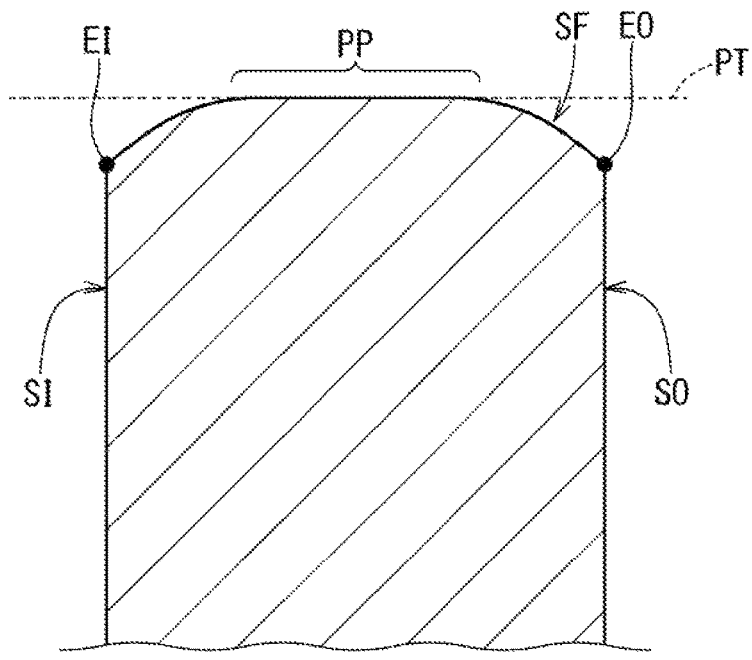
FIG. 5 illustrates a first modification of FIG. 4.

FIG. 5 illustrates a frame 812a that is a first modification of the frame 812 (FIG. 4). The most protruding portion PP has a flat portion in a cross-sectional view of the frame 812a spanning the inside and the outside of the cavity CV (FIG. 5). Thus, the attachment surface SF of the frame 812a can more stably support the lid 906 (FIG. 1).

Figure 6:
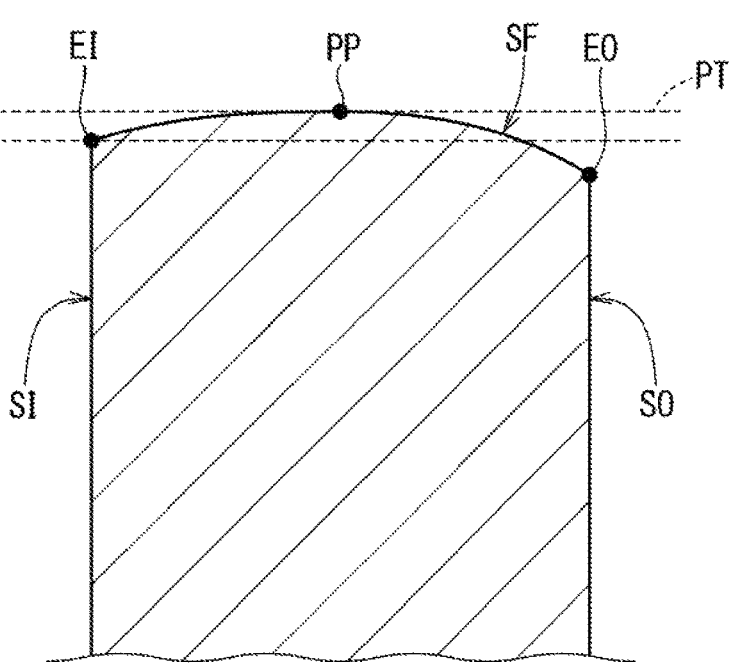
FIG. 6 illustrates a second modification of FIG. 4.

FIG. 6 illustrates a frame 812b that is a second modification of the frame 812 (FIG. 4). The outer end EO of the protruding shape of the attachment surface SF is made lower than the inner end EI of the protruding shape of the attachment surface SF in a cross-sectional view of the frame 812b spanning the inside and the outside of the cavity CV (FIG. 6). This can retard start of development of delamination between the frame 812 and the lid 906 due to the force from outside the package 800 acting near the outer end EO of the protruding shape, while reducing the amount of the adhesive layer 907 to some extent.

FIG. 7 illustrates a frame 812c that is a third modification of the frame 812 (FIG. 4). In this modification, the outer end EO of the protruding shape is made lower than the most protruding portion PP (i.e., the height position PT) of the protruding shape by 10 μm or more, whereas the inner end EI is not substantially lowered. In this modification, a portion of the frame 812c that is higher than the outer end EO is regarded as a portion where the frame 812c has a protruding shape. As another modification, the inner end EI of the protruding shape may be made lower than the most protruding portion PP (the height position PT) of the protruding shape by 10 μm or more, whereas the outer end EO need not be substantially lowered.

What has been described is the protruding shape of the attachment surface SF in a cross-sectional view taken along the line IV-IV (FIG. 3) crossing one of the sides (specifically, the long side) of the rectangular frame 812. In addition to this or as a replacement of this, the protruding shape described in the embodiment or its modifications may be formed in a cross-sectional view taken along a line A-A (FIG. 3) crossing one of the other sides (specifically, the short side) of the rectangular frame 812. When both of the sides have the protruding shapes, the protruding shape in the cross-sectional view taken along the line IV-IV need not be identical to that in the cross-sectional view taken along the line A-A. A square may be used as the aforementioned rectangle as one type of a rectangle. Preferably, the attachment surface SF of the frame 812 has the protruding shape described in the embodiment or its modifications in any cross-sectional view spanning the inside and the outside of the cavity CV. This can increase the adhesion strength all around the entire frame 812.

Figure 9:
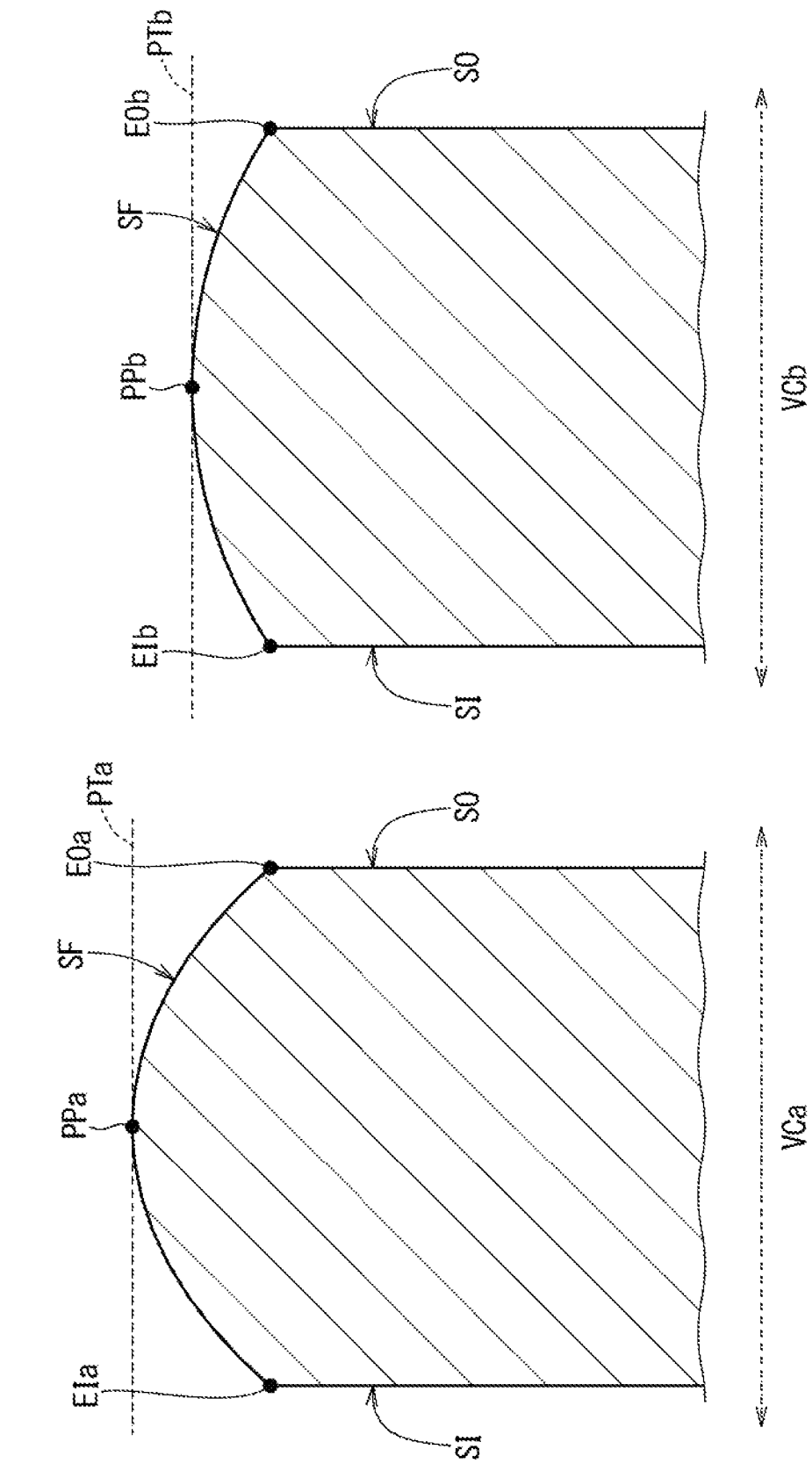
FIG. 9 illustrates cross-sectional views of the frame taken along the line IXa-IXa and the line IXb-IXb in FIG. 8.

FIG. 8 is a plan view schematically illustrating a structure of a frame 812V as a modification of the frame 812 (FIG. 3) in view of the aforementioned points. FIG. 9 illustrates a first cross-sectional view VCa taken along a line IXa-IXa (FIG. 8), and a second cross-sectional view VCb taken along the line IXb-IXb (FIG. 8). In the first cross-sectional view VCa, a most protruding portion PPa has a first height position PTa. At least one of an inner end EIa or an outer end EOa is made lower than the first height position PTa by 20 μm or more. In the second cross-sectional view VCb, a most protruding portion PPb has a second height position PTb. At least one of an inner end EIb or an outer end EOb is made lower than the second height position PTb by 10 μm or more and less than 20 μm. The second height position PTb in the second cross-sectional view VCb is lower than the first height position PTa in the first cross-sectional view VCa.

In a process of bonding the lid 906 to the frame 812V through the adhesive layer 907 (see FIG. 1) in the modification, a relative position of the frame 812V to the lid 906 in the thickness direction is mainly defined by the first height position PTa of the most protruding portion PPa and characteristics of the adhesive layer 907 (e.g., the viscosity of the adhesive layer 907 before the adhesive layer 907 is cured, and the size of fillers in the adhesive layer 907). Thus, the space between the lid 906 and the most protruding portion PPb lower than the most protruding portion PPa is greater than that between the lid 906 and the most protruding portion PPa. Thus, the adhesive layer 907 is much accumulated between the most protruding portion PPb and the lid 906. This can increase the adhesion strength in the second cross-sectional view VCb, where the most protruding portion PPb is located.

Here, at least one of the inner end EIa or the outer end EOa is made lower than the first height position PTa by 20 μm or more in the first cross-sectional view VCa, whereas at least one of the inner end EIb or the outer end EOb is made lower than the second height position PTb only by 10 μm or more and less than 20 μm in the second cross-sectional view VCb. This prevents the attachment surface SF from having an excessively low portion in the second cross-sectional view VCb.

The frame 812V (FIG. 8) may extend approximately along sides SD of a rectangle. The rectangle has a pair of first sides along a first direction (a horizontal direction in FIG. 8), and a pair of second sides along a second direction (a vertical direction in FIG. 8). For example, the first cross-sectional view VCa is for the pair of first sides, and the second cross-sectional view VCb is for the pair of second sides. Specifically, the first cross-sectional view VCa may be a view passing through the midpoint of the first sides, and the second cross-sectional view VCb may be a view passing through the midpoint of the second side. The first side may differ from the second side in length. For example, the first side is longer than the second side.

The embodiment or its modifications may be freely combined.

Although this invention is described in detail, the description is in all aspects illustrative, and does not restrict the invention. Therefore, numerous modifications and variations that have not yet been exemplified can be devised without departing from the scope of the invention.

What is claimed is:

1. A package including a mounting surface on which an electronic component is to be mounted, a cavity on the mounting surface, and an attachment surface to which a lid for sealing the cavity is to be attached through an adhesive layer, the package comprising:

a bottom containing ceramics and having the mounting surface;

a frame containing ceramics, enclosing the cavity on the bottom outside the mounting surface, and having the attachment surface; and a wiring part connecting an inside and an outside of the cavity, wherein the attachment surface of the frame includes an inner end adjacent to the cavity and an outer end opposite to the inner end in at least one cross-sectional view spanning the inside and the outside of the cavity, the attachment surface having a protruding shape protruding in a thickness direction, at least one of the inner end or the outer end being made lower than a most protruding portion of the protruding shape by 10 μm or more, the at least one cross-sectional view includes a first cross-sectional view and a second cross-sectional view, in the first cross-sectional view, the most protruding portion has a first height position, and at least one of the inner end or the outer end is made lower than the first height position by 20 μm or more, in the second cross-sectional view, the most protruding portion has a second height position, and at least one of the inner end or the outer end is made lower than the second height position by 10 μm or more and less than 20 μm, and the second height position in the second cross-sectional view is lower than the first height position in the first cross-sectional view.

2. The package according to claim 1, wherein the outer end of the protruding shape of the attachment surface is made lower than the most protruding portion of the protruding shape of the attachment surface by 10 μm or more.

3. The package according to claim 1, wherein each of the inner end and the outer end of the protruding shape of the attachment surface is made lower than the most protruding portion of the protruding shape of the attachment surface by 10 μm or more.

4. The package according to claim 1, wherein the outer end of the protruding shape of the attachment surface is made lower than the inner end of the protruding shape of the attachment surface.

5. The package according to claim 1, wherein a distance between the most protruding portion of the protruding shape of the attachment surface and each of the inner end and the outer end of the attachment surface in the thickness direction is shorter than or equal to 100 μm.

\* \* \* \* \*